United States Patent [19]

Lin

[11] Patent Number: 5,668,065
[45] Date of Patent: Sep. 16, 1997

[54] PROCESS FOR SIMULTANEOUS FORMATION OF SILICIDE-BASED SELF-ALIGNED CONTACTS AND LOCAL INTERCONNECTS

[75] Inventor: Chen-Hsi Lin, Cupertino, Calif.

[73] Assignee: Winbond Electronics Corp., Hsinchu, Taiwan

[21] Appl. No.: 690,972

[22] Filed: Aug. 1, 1996

[51] Int. Cl.⁶ .................... H01L 21/283; H01L 21/335
[52] U.S. Cl. .......................... 438/303; 438/649
[58] Field of Search .................. 437/41 SM, 193, 437/195, 200; 148/DIG. 19

[56] References Cited

U.S. PATENT DOCUMENTS

| | | | |
|---|---|---|---|
| 4,873,204 | 10/1989 | Wong et al. | 437/200 |
| 4,992,394 | 2/1991 | Kostelak, Jr. et al. | 437/229 |
| 5,166,771 | 11/1992 | Godinho et al. | 257/368 |
| 5,229,326 | 7/1993 | Dennison et al. | 437/195 |
| 5,385,634 | 1/1995 | Butler et al. | 156/644 |
| 5,547,900 | 8/1996 | Lin | 437/187 |

FOREIGN PATENT DOCUMENTS

| | | | |
|---|---|---|---|
| 0392725 | 10/1990 | European Pat. Off. | 437/200 |
| 89/11733 | 11/1989 | WIPO | 437/200 |

*Primary Examiner*—T. N. Quach
*Attorney, Agent, or Firm*—Meltzer, Lippe, Goldstein, et al.

[57] ABSTRACT

A process for simultaneously forming a self-aligned contact, a local interconnect and a self-aligned silicide in a semiconductor device. An oxide layer is deposited over a gate structure, a source region and a drain region formed on a substrate of the semiconductor device. The gate structure may be a multi-layer structure including a polysilicon gate, a silicon nitride layer and a tungsten silicide layer. The oxide layer deposited over the gate, source and drain is etched to define portions of the oxide layer which will form contact areas of a self-aligned contact and a local interconnect of the semiconductor device. An amorphous silicon layer is then deposited over the etched oxide layer to a thickness selected such that substantially the entire thickness of remaining portions of the amorphous silicon layer will be consumed during a subsequent silicidation reaction. The amorphous silicon layer is etched to remove portions of the amorphous silicon layer which will not be used to form a portion of the self-aligned contact and local interconnect, as well as remaining non-contact area portions of the underlying oxide layer. A metal layer is deposited over the etched amorphous silicon layer, and an annealing process is applied such that the etched amorphous silicon layer and the deposited metal layer react to provide a silicide layer which forms a portion of the self-aligned contact and the local interconnect. The annealing process also causes the deposited metal layer to react with exposed source and/or drain regions to thereby form a self-aligned silicide.

18 Claims, 2 Drawing Sheets

PROCESS FOR SIMULTANEOUS FORMATION OF SILICIDE-BASED SELF-ALIGNED CONTACTS AND LOCAL INTERCONNECTS

FIELD OF THE INVENTION

The present invention relates generally to semiconductor devices and more particularly to a process for simultaneously forming silicide-based self-aligned contacts and local interconnects in a metal-oxide-semiconductor (MOS) or other semiconductor device. The process may also be utilized to form self-aligned silicide, which is also known as salicide.

BACKGROUND OF THE INVENTION

In the ongoing effort to provide higher device packing density and reduced chip size for metal-oxide-semiconductor field effect transistor (MOSFET) integrated circuits, alignment error between different pattern layers has been and continues to be a major obstacle. A number of design rules have been developed in an attempt to alleviate the alignment error problem, including maintaining a minimum contact-to-gate distance so as to avoid shorting, and maintaining a minimum contact-to-diffusion overlapping distance to avoid junction leakage. These and other exemplary design rules are intended to provide sufficient tolerance to mask misalignment and other process variations such that integrated circuits can be reliably manufactured. However, it is becoming increasing difficult to achieve further reductions in device dimensions while adhering to such design rules. A number of alternative approaches have therefore been developed, including processes for forming silicide-based self-aligned contacts which permit contact-to-gate overlap yet still provide adequate protection against shorting. A self-aligned contact provides greater tolerance to misalignment by allowing a contact to FET source or drain region to overlap with an adjacent gate region. The overlap is permissible because the self-aligned contact is formed in a manner which provides additional insulation between the contact and the gate such that shorting is prevented. Unfortunately, many of the presently available self-aligned contact formation processes are unduly complex and therefore unsuitable for use in practical semiconductor manufacturing applications.

U.S. Pat. No. 5,166,771 describes an exemplary silicide-based self-aligned contact and interconnect structure in which self-aligned source and drain contacts are permitted to overlap the gate. The self-aligned contacts are prevented from shorting to the gate by oxide spacers adjacent the gate and a protective silicon nitride layer overlying the gate. A local interconnect between a gate of one FET and a source or drain of an adjacent FET is also provided in the following manner. A double layer photoresist and multi-step etch process are used to expose the gate to be connected to the local interconnect, and a buried contact mask process is used to expose the source or drain to be connected to the local interconnect. The exposed silicon of the gate and source or drain regions is silicided by depositing a layer of sputtered titanium about 700 Å thick and using rapid thermal annealing at 700° C. in a nitrogen atmosphere to form a layer of TiSi coated by a thin layer of titanium nitride. Any unreacted titanium is stripped away using a wet chemical 5:1:1 solution of water, hydrogen peroxide and ammonium hydroxide which also attacks and removes the titanium nitride layer. A second rapid thermal annealing step at 900° C. for 30 seconds in an atmosphere of ammonia converts the TiSi layer to a stable $TiSi_2$ silicide coated by a thin layer of titanium nitride. A silicide layer is thus formed over the exposed gate and source or drain regions.

The local interconnect between these regions is then formed from an additional layer of polysilicon deposited over and contacting the silicide layer. The polysilicon layer is masked and etched using an etching process selective to the underlying silicide layer to thereby define the local interconnect. A 500 Å layer of sputtered titanium is deposited over the etched polysilicon layer, followed by rapid thermal annealing at 640° C. in a nitrogen atmosphere for 60 seconds to form a $TiSi_2$ silicide local interconnect encapsulated by a thin titanium nitride film. The unreacted titanium and the titanium nitride film are stripped from the surface of the interconnect using the above-noted wet chemical solution. Although the processes disclosed in U.S. Pat. No. 5,166,771 may be used to provide both a silicide-based self-aligned contact to a source or drain region as well as a silicide-based local interconnect, separate process steps are required to form these different structures. This unduly complicates the self-aligned contact and local interconnect formation process and results in a costly, time-consuming and therefore impractical manufacturing operation. The disclosed processes also suffer from additional problems. For example, the use of a double layer photoresist to expose the poly gate region is inherently difficult to control.

A number of other known self-aligned contact processes fail to address adequately the formation of a local interconnect. U.S. Pat. No. 5,385,634 discloses an exemplary self-aligned contact formation process in which a gate electrode is sealed by a combination of a titanium nitride layer and a silicon nitride layer to prevent shorting with an overlapping source or drain contact. However, the disclosed process does not describe how a silicide-based local interconnect may be efficiently formed in conjunction with the self-aligned contact.

As is apparent from the above, a need exists for an improved process for forming silicide-based self-aligned contacts and local interconnects in a semiconductor device. The improved process should be relatively simple and easy to control, and therefore suitable for use in numerous practical semiconductor device manufacturing applications.

SUMMARY OF THE INVENTION

The present invention provides a process which may be used to form both silicide-based self-aligned contacts and local interconnects in a semiconductor device. The process may also be used to form self-aligned silicide, which is also known as salicide. The process allows these and other elements to be formed substantially simultaneously and therefore in a manner which is significantly less complex and easier to control than conventional self-aligned processes.

In accordance with one aspect of the invention, a process is provided for forming a self-aligned contact and a local interconnect on a semiconductor device. An oxide layer is deposited over a gate structure, a source region and a drain region formed on a substrate of the semiconductor device. The gate structure may be a multi-layer structure including a polysilicon gate and a silicon nitride layer. The oxide layer deposited over the gate structure and source and drain regions is etched to define portions of the oxide layer which include contact areas for a self-aligned contact and a local interconnect. An amorphous silicon layer is then deposited over the etched oxide layer to a thickness selected such that substantially the entire thickness of remaining portions of the amorphous silicon layer will be consumed in a subsequent silicidation process. The amorphous silicon layer is etched to remove portions of the amorphous silicon layer which will not be used to form the self-aligned contact or local interconnect, as well as to remove remaining non-contact area portions of the oxide layer. A metal layer is deposited over the etched amorphous silicon layer, and an annealing process is applied such that the amorphous silicon layer and the deposited metal layer react to provide a silicide layer which forms a portion of the self-aligned contact and local interconnect. The annealing process also causes the deposited metal layer to react with any exposed source and/or drain regions such that a self-aligned silicide may be formed simultaneously with the self-aligned contact and local interconnect.

BRIEF DESCRIPTION OF THE DRAWINGS

FIG. 1 shows the semiconductor device after formation of gate, drain and source regions on a substrate.

FIG. 2 shows the semiconductor device after patterning of a thin oxide layer used in self-aligned contact and local interconnect formation in accordance with the invention.

FIG. 3 shows the semiconductor device after patterning of an amorphous silicon layer used in self-aligned contact and local interconnect formation in accordance with the invention.

FIG. 4 shows the semiconductor device after deposition of titanium and titanium nitride layers in accordance with a silicide process suitable for use with the present invention.

FIG. 5 shows the semiconductor device after simultaneous formation of a self-aligned contact, a local interconnect and a self-aligned silicide in accordance with the present invention.

DETAILED DESCRIPTION OF THE INVENTION

The present invention will be illustrated below as applied to the formation of an exemplary semiconductor device structure. It should be understood that the invention is more broadly applicable to numerous alternative processes involving metal-oxide-semiconductor (MOS) devices, complementary MOS (CMOS) devices as well as other types of integrated circuit devices. In addition, the device dimensions, materials, thicknesses and other illustrative features set forth in the following description should not be construed as limiting the invention to any particular application or group of applications. The term "self-aligned contact" as used herein refers generally to a source or drain contact which is formed such that it may overlap an adjacent gate. The term "local interconnect" refers generally to any interconnection between elements of a semiconductor device, such as an interconnection between a gate, source or drain of one FET and a gate, source or drain of another FET in the same device.

FIGS. 1 through 5 show side sectional views of a portion of a semiconductor device after performance of different groups of steps in an exemplary process in accordance with the invention. The semiconductor device is an exemplary MOS structure shown in simplified form for purposes of clarity.

Figure 1:
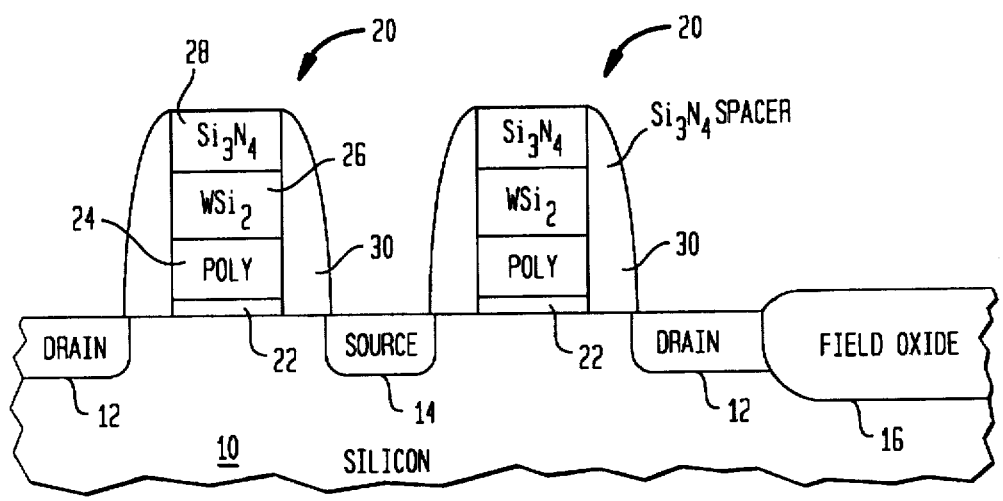
FIGS. 1 through 5 illustrate side sectional views of an exemplary semiconductor device after performance of process steps in accordance with the present invention.

FIG. 1 illustrates the MOS semiconductor device after formation of gate, drain and source regions on a substrate. A silicon substrate 10 has drain regions 12 and a source region 14 formed therein. A relatively thick field oxide 16 serves to isolate different devices formed on the substrate 10. Multilayer gate structures 20 are formed over the channels between drain regions 12 and source region 14. Each multilayer gate structure 20 includes a thin gate oxide 22, a polysilicon gate 24, a tungsten silicide (WSi$_2$) layer 26 which serves to reduce the parasitic gate resistance, and a silicon nitride (Si$_3$N$_4$) layer 28. The gate structures 20 further include oxide spacers 30 which are used to provide a lightly-doped drain (LDD) region within a portion of a drain region 12 adjacent a gate structure 20. The oxide spacers 30 also provide isolation of the polysilicon gate 24 from a subsequently-formed self-aligned contact, as will be described in greater detail below.

The device illustrated in FIG. 1 may be formed in the following manner. A conventional field isolation process is applied to the substrate 10 to thereby form the relatively thick field oxide 16 which as noted above will serve to isolate adjacent devices formed on the substrate 10. A channel threshold implantation step is applied after formation of the field oxide 16. A well formation process may also be applied, although the exemplary semiconductor device of FIGS. 1–5 is illustrated as not including a well. A gate oxide layer is then formed over the substrate 10 to a thickness on the order of 50 to 200 Å using a conventional wet or dry oxidation process. Well-known chemical vapor deposition (CVD) processes are then used to form successive layers of polysilicon, tungsten silicide and silicon nitride over the gate oxide layer. The polysilicon, tungsten silicide and silicon nitride layers may each be formed to a thickness on the order of 1000 to 2000 Å. This stack of layers is then patterned and etched to form the gate oxide 22, polysilicon gate 24, tungsten silicide layer 26 and silicon nitride layer 28 shown in the multi-layer gate structure 20. After formation of the gate structures 20, a conventional LDD process is applied which involves the formation of oxide spacers 30 and formation of the lightly-doped portions of the drain regions 12. Additional implantation steps are then applied to complete the formation of the drain regions 12 and source region 14.

Figure 2:
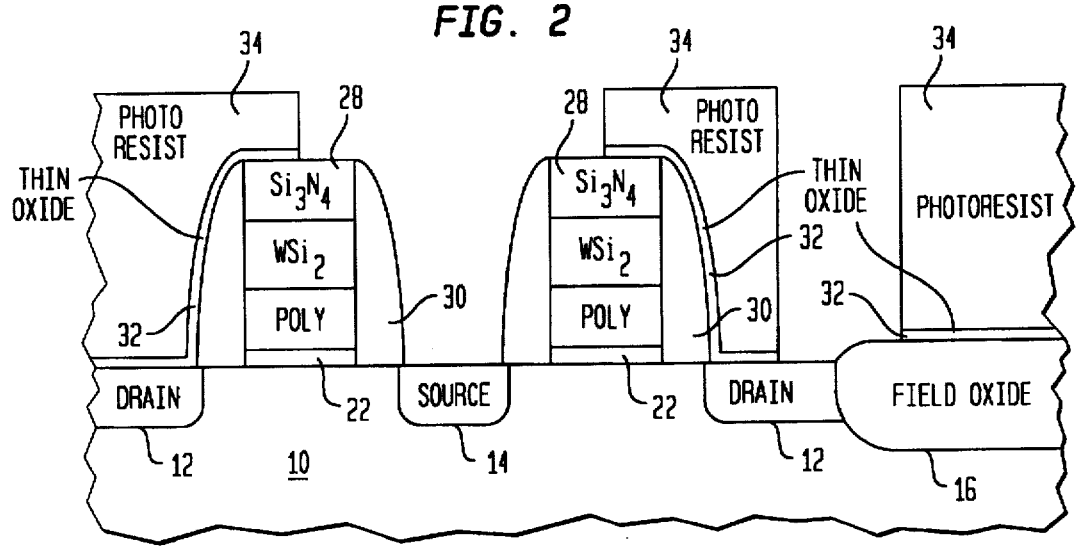

FIG. 2 illustrates the MOS semiconductor device as shown in FIG. 1 after deposition and patterning of a thin oxide layer used in self-aligned contact and local interconnect formation in accordance with the invention. A thin oxide layer 32 is deposited over the device of FIG. 1 to a thickness on the order of 500 to 1500 Å using a conventional CVD process. A layer of photoresist 34 is applied over the thin oxide layer 32. The layer of photoresist 34 is patterned in a conventional manner to expose portions of the thin oxide layer 32 which will not be used to form contact areas for a self-aligned contact and a local interconnect. The exposed portions of the thin oxide layer 32 are then etched away using either a wet chemical or a dry plasma etching process, to thereby provide the device as shown in FIG. 2. The portions of thin oxide layer 32 remaining in the device of FIG. 2 will be further etched in a manner to be described in greater detail below to provide the contact areas for the self-aligned contact and local interconnect. Alternatives to the oxide layer 32 include any substantially non-conductive dielectric layer providing a desired amount of electrical insulation.

Figure 3:
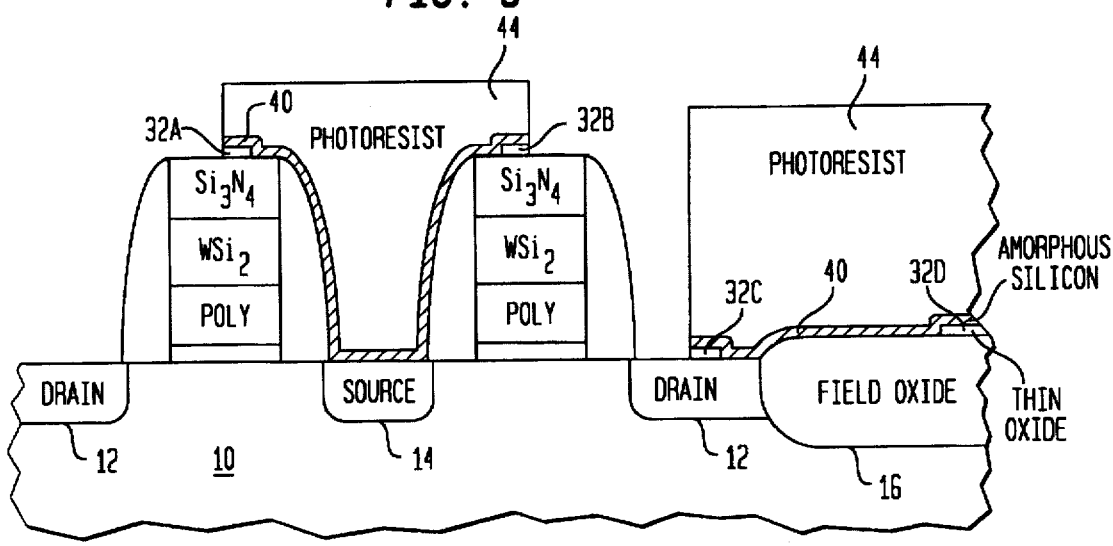

FIG. 3 illustrates the MOS semiconductor device as shown in FIG. 2 after patterning of a silicon layer used in self-aligned contact and local interconnect formation in accordance with the invention. The photoresist layer 34 shown in FIG. 2 is removed. An amorphous silicon layer 40 is then deposited over the device to a thickness on the order of 100 to 1000 Å using a plasma CVD or sputtering process. Alternatives to the amorphous silicon layer include a doped or undoped polysilicon layer. The thickness of the amorphous silicon layer 40 is selected such that portions of this layer remaining after etching are substantially consumed during a subsequent silicidation reaction to be described in greater detail below. A photoresist layer 44 is then applied over the amorphous silicon layer 40. The photoresist layer 44 is patterned to expose portions of the amorphous silicon layer 40 which will be subsequently used to form the self-aligned contact to the source region 14 and the local interconnect to a drain region 12. The exposed portions of the amorphous silicon layer 40 are then etched away using a process which is highly selective to the underlying thin oxide layer 32. A sufficiently high selectivity ratio is on the order of about 50:1 to 100:1 such that the amorphous silicon is etched at a rate about 50 to 100 times the rate at which the underlying thin oxide is etched. A suitable etching process providing this high selectivity to the thin oxide layer 32 is a plasma etching process using HBr and $Cl_2$ gases. Portions of the thin oxide layer 32 not underlying the photoresist layer 44 are then removed using an etching process which is highly selective to silicon. A sufficiently high selectivity ratio for this etching process is on the order of about 10:1 such that the thin oxide is etched at a rate about 10 times the rate at which any underlying silicon in drain regions 12 is etched. A suitable etching process providing this high selectivity to silicon is a plasma etching process using $CHF_3$ gas. FIG. 3 illustrates the device after removal of the exposed portions of the amorphous silicon layer 40 and thin oxide layer 32. The remaining portions of the thin oxide layer 32 shown in FIG. 3 include contact areas 32A, 32B which will form a part of self-aligned contact and contact areas 32C, 32D which will form a part of a local interconnect.

Figure 4:
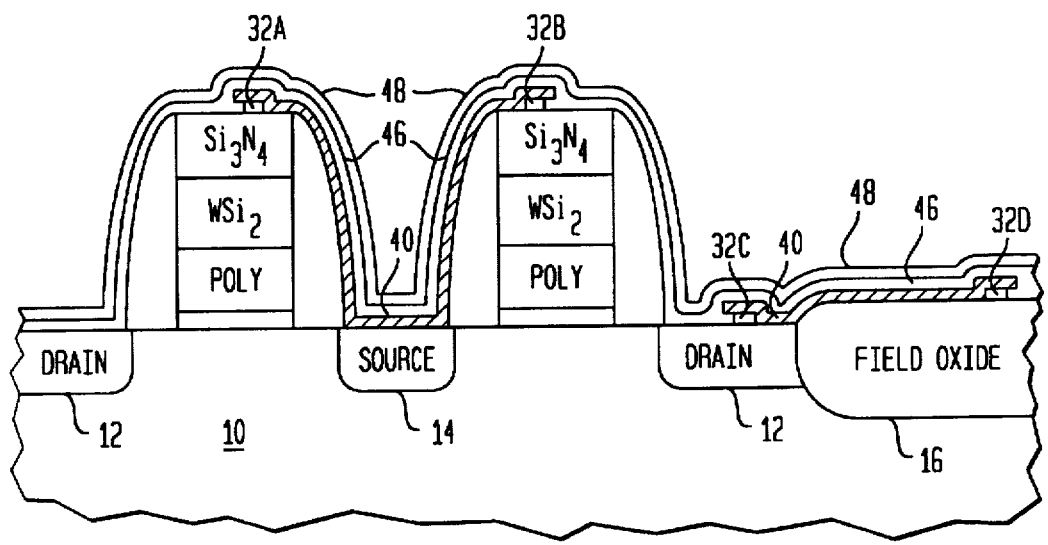

FIG. 4 illustrates the MOS semiconductor device of FIG. 3 after deposition of titanium and titanium nitride layers in accordance with a silicide process suitable for use with the present invention. The photoresist layer 44 shown in FIG. 3 is removed. A layer of titanium (Ti) 46 is then deposited to a thickness of 200 to 800 Å using a sputtering process. A layer of titanium nitride TiN 48 is deposited over the titanium layer 46 to a thickness of 200 to 800 Å using a sputtering process. Other metals or materials suitable for use in a silicide process may be used in place of the titanium and titanium nitride layers 46, 48, including, for example, cobalt, nickel and tantalum. The deposition of the titanium and titanium nitride layers 46, 48 may be performed in accordance with a conventional self-aligned silicide processes such as those described in the above-cited U.S. Pat. Nos. 5,166,771 and 5,385,634, which are incorporated by reference herein.

Figure 5:
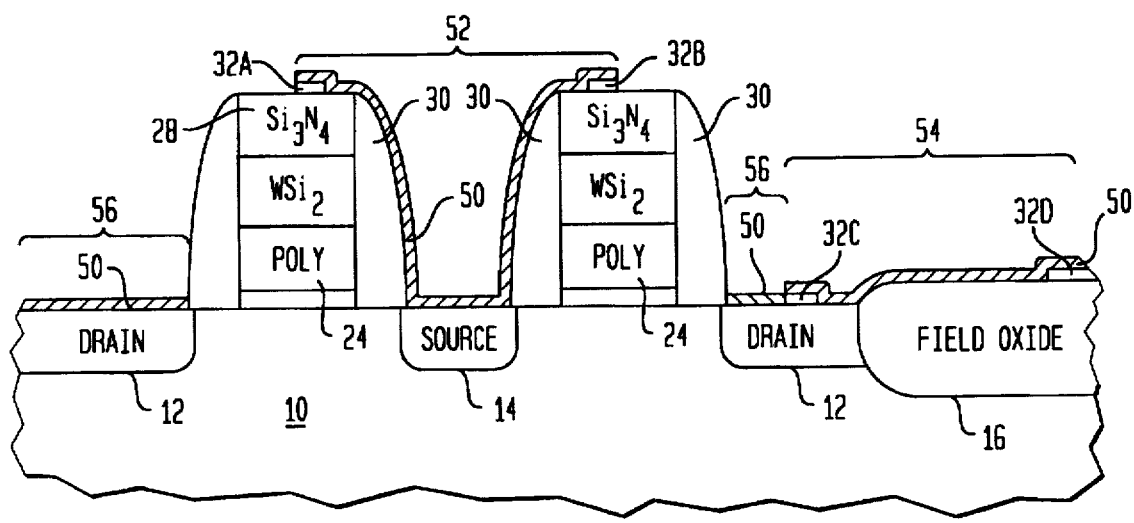

FIG. 5 illustrates the MOS semiconductor device of FIG. 4 after simultaneous formation of a self-aligned contact, a local interconnect and a self-aligned silicide in accordance with the present invention. A rapid thermal anneal process is first applied to the device using a temperature of about 600° C. to 700° C. in an atmosphere of argon or nitrogen such that the deposited titanium and titanium nitride layers 46, 48 react with the amorphous silicon layer 40 and any exposed portions of the drain regions 12 to form a silicide layer 50. A wet chemical solution of $NH_4OH$ and $H_2O$ or $H_2SO_4$ and $H_2O_2$ is used to remove any unreacted metal from the silicide layer 50. A second rapid thermal anneal process may then be performed to complete the silicide formation. The second rapid thermal anneal process may be carried out at a higher temperature than the first anneal process, such as a temperature on the order of about 700° C. to 900° C., in an atmosphere of argon or nitrogen. The resulting silicide layer 50 has a relatively low resistance, on the order of about 1 to 50 ohms per square. These silicide-forming steps may also be performed in accordance with conventional techniques such as those described in the above-cited U.S. Pat. No. 5,166,771.

A portion of the silicide layer 50 serves as a self-aligned contact 52 to source region 14, while another portion of the silicide layer 50 serves as a local interconnect 54 connecting a drain region 12 to a field oxide region 16. Other portions of the silicide layer 50 formed by reaction with an exposed drain region 12 serve as self-aligned silicide 56. It can be seen from FIG. 5 that the self-aligned contact 52 overlaps the gate structures of the semiconductor device, which permits substantially more tolerance to misalignment and therefore significant reductions in device dimensions. Shorting is prevented in the self-aligned contact 52 via the oxide spacers 30 and the silicon nitride layer 28. Although shown as providing an interconnection to a source region, a self-aligned contact in accordance with the invention may also be utilized to provide a connection to a drain region. The local interconnect 54 is shown in FIG. 5 as connecting an exemplary drain region 12 to a field oxide region 16, but in alternative embodiments similar processing steps may be used to form numerous other local interconnect configurations. The self-aligned silicide regions 56 shown in FIG. 5 may be used, for example, to decrease parasitic source or drain resistance, or to provide a low resistance current path.

The present invention provides a process for accurately and efficiently forming self-aligned contacts, local interconnects and/or self-aligned silicide in a semiconductor integrated circuit device. The invention permits these elements to be formed simultaneously in an efficient process which is substantially less complex than prior art self-aligned contact processes and is therefore well-suited for use in a variety of practical semiconductor manufacturing operations.

The above-described embodiments of the invention are intended to be illustrative only. Numerous other embodiments of the invention falling within the scope of the appended claims will be apparent to those of ordinary skill in the art.

The invention claimed is:

1. A process for forming a semiconductor device comprising the steps of:

depositing an oxide layer over a gate structure, a source region and a drain region formed on a substrate of the semiconductor device;

etching the oxide layer to define portions of the oxide layer which will form contact areas of a self-aligned contact and a local interconnect of the semiconductor device;

depositing a silicon layer over the etched oxide layer;

etching the silicon layer to remove remaining non-contact area portions of the oxide layer as well as portions of the silicon layer which will not be used to form part of the self-aligned contact and the local interconnect;

depositing a metal layer over the etched silicon layer; and annealing the semiconductor device such that the etched silicon layer and the deposited metal layer react to form a silicide layer which comprises part of the self-aligned contact and local interconnect.

2. The process of claim 1 wherein the silicide layer further comprises a portion of a self-aligned silicide.

3. The process of claim 1 further including the step of forming the gate structure on the substrate as a multi-layer structure including a silicon nitride layer and a tungsten silicide layer.

4. The process of claim 1 wherein the step of depositing an oxide layer further includes depositing the oxide layer to a thickness of approximately 500 to 1500 Å.

5. The process of claim 1 wherein the step of depositing a silicon layer further includes depositing an amorphous silicon layer such that substantially the entire thickness of remaining portions of the amorphous silicon layer will be consumed in a subsequent silicidation reaction.

6. The process of claim 5 wherein the step of depositing a silicon layer further includes depositing an amorphous silicon layer to a thickness of approximately 100 to 1000 Å.

7. The process of claim 1 wherein the step of etching the silicon layer further includes the steps of:

removing the portions of the silicon layer using a first etching process highly selective to the underlying oxide layer; and removing remaining portions of the oxide layer using a second etching process highly selective to silicon.

8. The process of claim 1 wherein the step of depositing a metal layer over the etched silicon layer further includes the steps of:

depositing a titanium layer over the etched silicon layer; and depositing a titanium nitride layer over the titanium layer.

9. The process of claim 8 wherein at least one of the titanium layer and the titanium nitride layer are deposited to a thickness of approximately 200 to 800 Å.

10. A process for forming a semiconductor device comprising the steps of:

depositing an oxide layer over a gate structure, a source region and a drain region formed on a substrate of the semiconductor device;

etching the oxide layer to define portions of the oxide layer which will form contact areas of at least one of a self-aligned contact and a local interconnect of the semiconductor device;

depositing a silicon layer over the etched oxide layer;

etching the silicon layer to remove remaining non-contact area portions of the oxide layer as well as portions of the silicon layer which will not be used to form part of the at least one self-aligned contact and local interconnect;

depositing a metal layer over the etched silicon layer; and processing the semiconductor device such that the silicon layer and the deposited metal layer react to form a silicide layer which comprises a part of the at least one self-aligned contact and local interconnect.

11. The process of claim 10 wherein the silicide layer further comprises a portion of a self-aligned silicide.

12. The process of claim 10 further including the step of forming the gate structure on the substrate as a multi-layer structure including a silicon nitride layer and a tungsten silicide layer.

13. The process of claim 10 wherein the step of depositing an oxide layer further includes depositing the oxide layer to a thickness of approximately 500 to 1500 Å.

14. The process of claim 10 wherein the step of depositing a silicon layer further includes depositing an amorphous silicon layer such that substantially the entire thickness of remaining portions of the amorphous silicon layer will be consumed in a subsequent silicidation reaction.

15. The process of claim 14 wherein the step of depositing a silicon layer further includes depositing an amorphous silicon layer to a thickness of approximately 100 to 1000 Å.

16. The process of claim 10 wherein the step of etching the silicon layer to thereby remove portions of the silicon layer and remaining portions of the oxide layer further includes the steps of:

removing the portions of the silicon layer using a first etching process highly selective to the underlying oxide layer; and removing remaining portions of the oxide layer using a second etching process highly selective to silicon.

17. The process of claim 10 wherein the step of depositing a metal layer over the etched silicon layer further includes the steps of:

depositing a titanium layer over the etched silicon layer; and depositing a titanium nitride layer over the titanium layer.

18. The process of claim 17 wherein at least one of the titanium layer and the titanium nitride layer are deposited to a thickness of approximately 200 to 800 Å.

* * * * *